US010225934B2

(12) United States Patent
Kegeler

(10) Patent No.: US 10,225,934 B2
(45) Date of Patent: Mar. 5, 2019

(54) MAGNETIC CIRCUIT BOARD AND METHOD FOR MANUFACTURING SAME

(71) Applicant: Schaeffler Technologies AG & Co. KG, Herzogenaurach (DE)

(72) Inventor: Joerg Kegeler, Schleusingen (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 0 days.

(21) Appl. No.: 15/313,457

(22) PCT Filed: Mar. 19, 2015

(86) PCT No.: PCT/DE2015/200168
§ 371 (c)(1),
(2) Date: Nov. 22, 2016

(87) PCT Pub. No.: WO2015/180712
PCT Pub. Date: Dec. 3, 2015

(65) Prior Publication Data
US 2017/0156210 A1 Jun. 1, 2017

(30) Foreign Application Priority Data

May 26, 2014 (DE) .................. 10 2014 210 013

(51) Int. Cl.
*H05K 1/16* (2006.01)
*H05K 1/11* (2006.01)
(Continued)

(52) U.S. Cl.
CPC ........... *H05K 1/165* (2013.01); *H01F 1/0306* (2013.01); *H01F 3/10* (2013.01); *H01F 27/365* (2013.01);
(Continued)

(58) Field of Classification Search
CPC ......... H01F 2017/006; H01F 2017/002; H01F 27/2804; H05K 1/0233; H05K 1/165;
(Continued)

(56) References Cited

U.S. PATENT DOCUMENTS 4,755,783 A * 7/1988 Fleischer ............ H01F 17/0006
336/180
5,552,756 A * 9/1996 Ushiro ................ H01F 17/0013
336/200
(Continued)

FOREIGN PATENT DOCUMENTS

DE 102007055291 6/2008
DE 102008049756 5/2010
(Continued)

*Primary Examiner* — Chau N Nguyen
*Assistant Examiner* — Roshin K Varghese
(74) *Attorney, Agent, or Firm* — Davidson, Davidson & Kappel, LLC

(57) ABSTRACT

A circuit board (01), including at least two electrically conductive layers (02) arranged one above the other and at least one dielectric layer (03), which is arranged between adjacent electrically conductive layers (02), is provided. The circuit board (01) is characterized in particular in that the plate has at least two magnetically conductive layers (05), wherein each magnetically conductive layer (05) is arranged at least indirectly adjacent to an electrically conductive layer (02), and that the circuit board also has vertical recesses for accommodating magnetic vias (08) for connecting the magnetically conductive layers (05) in a specific manner. A method for producing such a circuit board (01) is provided.

15 Claims, 1 Drawing Sheet

(51) Int. Cl.
*H05K 1/02* (2006.01)
*H05K 1/03* (2006.01)
*H05K 3/00* (2006.01)
*H05K 3/42* (2006.01)
*H01F 3/10* (2006.01)
*H01F 27/36* (2006.01)
*H01F 17/00* (2006.01)
*H01F 1/03* (2006.01)

(52) U.S. Cl.
CPC ............ *H05K 1/028* (2013.01); *H05K 1/115* (2013.01); *H05K 3/429* (2013.01); *H01F 2017/0066* (2013.01); *H05K 1/0233* (2013.01); *H05K 1/036* (2013.01); *H05K 3/0097* (2013.01); *H05K 2201/086* (2013.01); *H05K 2201/09309* (2013.01)

(58) Field of Classification Search
CPC .... H05K 1/112; H05K 1/115; H05K 2201/08; H05K 2201/083; H05K 2201/086
See application file for complete search history.

(56) References Cited

U.S. PATENT DOCUMENTS

| | | | |
|---|---|---|---|
| 6,573,821 B2 | 6/2003 | Peels et al. | |
| 6,820,321 B2* | 11/2004 | Harding | H01F 17/0033 336/200 |
| 6,887,560 B2* | 5/2005 | Nakamura | H05K 3/4617 174/254 |
| 7,145,427 B2* | 12/2006 | Yoshida | H01F 17/0013 336/200 |
| 7,375,609 B2 | 5/2008 | Suzuki | |
| 8,164,001 B2 | 4/2012 | Yoshida et al. | |
| 9,329,022 B2 | 5/2016 | Kegeler et al. | |
| 2003/0137384 A1* | 7/2003 | Itou | H01F 17/0013 336/200 |
| 2003/0151480 A1* | 8/2003 | Orr | H01H 67/30 335/78 |
| 2008/0224937 A1* | 9/2008 | Kimura | C04B 35/265 343/787 |
| 2008/0238601 A1 | 10/2008 | Das et al. | |
| 2010/0109123 A1* | 5/2010 | Strzalkowski | H01F 17/0013 336/200 |
| 2013/0200977 A1* | 8/2013 | Miyazaki | H01L 24/24 336/192 |
| 2014/0034373 A1* | 2/2014 | Yoshikawa | H01F 5/003 336/200 |
| 2014/0266505 A1 | 9/2014 | Meyer | |

FOREIGN PATENT DOCUMENTS

| | | |
|---|---|---|
| EP | 0878984 | 11/1998 |
| EP | 2028723 | 2/2009 |
| FR | 2982453 | 5/2013 |
| WO | WO2005024862 | 3/2005 |
| WO | WO 2011/134955 A2 | 11/2011 |

* cited by examiner

MAGNETIC CIRCUIT BOARD AND METHOD FOR MANUFACTURING SAME

The present invention relates to a magnetic circuit board and a method for manufacturing same.

BACKGROUND

Circuit boards, also known by the term "printed circuit boards," are used as carriers for electronic components. Circuit boards are made up of electrically insulating material with electrically conductive connections (strip conductors) adhered thereto. Circuit boards of various quality and price classes are available, depending on the desired or required mechanical, electrical, and thermal stability. Thus, comparatively inexpensive circuit boards made of a base material of epoxy resin and paper (material identifier FR3) may be used. In addition, more heat-resistant circuit boards made of a base material of epoxy resin and glass fiber fabric (material identifier FR4) may be used. Furthermore, flexible circuit boards are known which, for example, are made of polyamide and have a high heat resistance (>300° C.). Circuit boards may bear a conductive layer, generally a copper layer, on one or both sides. Multilayer circuit boards are also known in which additional electrically conductive layers are situated between layers of insulating base material.

Various technologies for manufacturing circuit boards are known from the prior art. Mentioned among others, for example, is the planar technology used for manufacturing semiconductor components and chips, in which the semiconductor material is doped on selected areas of the surface with the aid of diffusion, resulting in planar structures in parallel to the surface. Multiple layers are connected to one another for manufacturing so-called multilayer circuit boards. The connections between the individual layers of multilayer circuit boards are established with vias. Vias are usually implemented by internally metal-plated boreholes in the carrier material of the circuit board.

The electrical conductor structures on circuit boards are generally produced photochemically by appropriately structuring a photoresist, i.e. a photosensitive film. For manufacture in a panel, multiple individual circuit boards are situated next to one another to form a large circuit board, and are thus produced in combination. Lastly, the overall circuit board is separated into individual circuit boards.

Circuit boards have a wide variety of uses, so that virtually any electronic device contains one or multiple circuit boards.

WO 2011/134955 A2 describes a roller bearer system which includes an angle sensor, and a method for installing such a roller bearing system which includes an angle sensor. The angle sensor includes a sensor ring that is connected in a rotatably fixed manner to the outer ring, and a measuring scale that is designed as a metal ring which is eccentric relative to the rotation axis of the roller bearing and connected in a rotatably fixed manner to the inner ring. As a metallic component, the sensor ring includes an annular U-shaped pot core concentric to the rotation axis of the roller bearing. A retaining element made of plastic, which is fastened in a circumferential groove in the outer ring, is used for retaining the pot core and the sensor ring on the outer ring. A support ring made of sheet metal, which strikes against the front side of the outer ring and which is used as an installation aid and represents mechanical protection for the angle sensor, is situated radially outside the retaining element. An annular space for accommodating the sensor ring is formed between the inner lateral surface of the support ring and the retaining element. The sensor ring includes a transmitter coil situated in a plane that is in parallel to the front side of the roller bearing and situated completely within the U profile of the pot core. The transmitter coil is designed as a printed circuit on a multilayer circuit board. Various receiver coils cooperate with the transmitter coil. Each of the receiver coils is partially situated within the U profile of the pot core, and partially outside this U profile. The receiver coils, similarly as for the transmitter coil, are designed as a printed circuit. A signal is transmittable between the transmitter coil and the receiver coil via a magnetic circuit, the transmitter coil being situated within the U-shaped pot core, which forms part of the magnetic circuit. A variable reluctance in the magnetic circuit is indicated via the measuring scale. The metal ring, which acts as a measuring scale, closes the magnetic circuit between the legs of the U-shaped pot core. The described angle sensor is made up of many individual components, which involves complicated manufacture (while maintaining narrow manufacturing tolerances) as well as a complex assembly.

SUMMARY OF THE INVENTION

It is an object of the present invention to provide a circuit board which in addition to the customary electrical functions may also fulfill magnetic functions. A further aim is to provide a method for manufacturing such a circuit board.

The circuit board according to the present invention includes at least two electrically conductive layers situated one above the other and spaced apart from one another, and at least one dielectric layer situated between these electrically conductive layers. It is essential to the present invention that the circuit board additionally includes at least two magnetically conductive layers, each magnetically conductive layer being situated at least indirectly adjacent to an electrically conductive layer. Another feature essential to the present invention is that the circuit board has vertical recesses for accommodating magnetic vias for connecting the magnetically conductive layers in a targeted manner. The preferably structured, magnetically conductive layers are thus magnetically connected in a punctiform manner, as the result of which the magnetic flux may be conducted between the magnetic layers in a targeted manner.

A significant advantage of the circuit board according to the present invention is that it allows the manufacture of electromagnetic products with a small installation space at low cost, and in large as well as small production volumes. The technically mature manufacturing technologies in the area of circuit board manufacture may thus also be utilized for manufacturing magnetic functional units with little adaptation effort. The combination of electrically conductive layers and magnetically conductive layers in a circuit board allows the manufacture of electromagnetic products such as sensors, motors, and generators completely within the scope of customary electrical circuit board manufacturing. Known and well-established technologies for manufacturing electrical circuit boards may thus be relied on, thus making highly efficient production possible. In the process, the same optimized technology and production line may always be utilized. New products may thus be manufactured without additional capital costs. The pathway to the product is very short, since it is reduced essentially to the construction of the circuit board. As a result, large as well as small production volumes may be achieved with little effort. Prototypes and mass-produced products are thus manufacturable in a similarly optimal manner. The high quality standards of conventional electrical circuit board manufacture are available. The processes of quality assurance (QA) and quality control (QC) remain the same in some respects for all products.

Another advantage is that the mechanical, electrical, and thermal stability of circuit boards of various quality and price classes may be utilized. Thus, reasonably priced products based on inexpensive circuit boards made of a base material with the material identifier FR3 may be implemented. In contrast, heat-resistant products may be manufactured based on heat-resistant circuit boards made of a base material such as that with material identifier FR4. Flexible magnetic structures may be manufactured based on flexible circuit boards. Flexible motors and sensors are thus possible.

A connection among the magnetically conductive layers is made possible with the aid of the magnetic vias, thus expanding the magnetic flux conduction into the third dimension in a targeted manner. The three-dimensional combination of the electrical and the magnetic circuit board allows novel products with a small installation space and at low cost.

According to one advantageous specific embodiment, the magnetic vias include a magnetically conductive material which is introduced into the recesses. The magnetically conductive material may be a paste-like material, for example, which contains ferromagnetic powder, for example iron powder or ferrite powder of various alloys. Paste-like materials are easy to handle, and are introducible into the recesses with little effort in order to create magnetic vias. Alternatively, however, rivets, pins, or sleeves made of magnetically conductive material may also be used, which are introduced into the recesses and suitably connected to the circuit board.

The magnetically conductive layers are preferably provided as outer layers of the circuit board. However, it is also possible to design circuit boards with any desired sequence of magnetic and electrical layers. A symmetrical sequence of the various layers in the multilayer design may be advantageous for improving the thermal stability.

In one advantageous specific embodiment, the magnetically conductive layers are made of ferromagnetic powder-filled plastic sheets or metal sheets. For example, iron powder or ferrite powder of various alloys may be used as ferromagnetic powder. Ferromagnetic powder-filled plastic sheets are particularly suitable, since they may be processed similarly as for the FR4 base material. FR4 base material is frequently used in electrical circuit board manufacturing, so that a proven knowledge base may be relied on. In addition, a wide variety of special foil materials may be used which have magnetic flux-collecting (mu metal) properties or shielding properties, for example.

The electrically conductive layers, which are preferably structured, for forming a conductor structure are preferably connected to one another with the aid of electrical vias. The electrical vias may advantageously be implemented with metal-plated walls.

According to one modified specific embodiment, an auxiliary layer which is used for electrical and/or magnetic and/or thermal insulation is situated between the electrically conductive layer and the adjacent magnetically conductive layer. The magnetically conductive layer is then situated indirectly adjacent to the electrically conductive layer.

It may also be advantageous to apply a cover layer to the outer sides of the circuit board, which in particular is also used for protecting the circuit board from environmental influences.

Specific embodiments in which the electrically conductive layers form at least one coil have proven to be particularly advantageous.

According to one preferred specific embodiment, the circuit board according to the present invention is designed as a panel which includes a plurality of adjacently situated individual circuit boards, the magnetically conductive layers being applied over the entire surface area of the panel.

The method according to the present invention includes the following steps: A multilayer circuit board is initially produced which includes at least two electrically conductive layers which are spaced apart from one another, at least one dielectric layer situated between these adjacent electrically conductive layers, and at least two magnetically conductive layers which are spaced apart from one another, each being situated adjacent to one of the electrically conductive layers. First and second recesses are subsequently introduced into the multilayer circuit board. In addition, magnetically conductive material is introduced into the first recesses in order to connect the magnetically conductive layers to one another. The walls of the second recesses are metal-plated, thus producing electrical vias, with the aid of which the electrically conductive layers are connected to one another.

According to one preferred specific embodiment of the method, the magnetically conductive layers are provided as outer layers of the multilayer circuit board. In this embodiment, in the first step the circuit board may be manufactured based on a conventional multilayer electrical circuit board, in which a magnetically conductive layer, for example in the form of a ferromagnetic powder-filled plastic sheet, is additionally attached as a cover layer and base layer, using the customary technologies and materials. The magnetically conductive layer may be laminated on, for example.

The recesses and vias are introduced, and structurings optionally provided, in the next step. Since the recesses which are introduced for implementing the magnetic vias are not introduced until the layers are connected, and are then filled with magnetically conductive material, a direct large-surface contact between the magnetic vias and the magnetic layers may be achieved. As a result, there is no adhesive layer between the magnetically conductive layers and the magnetically conductive material in the first recesses. The contact surface area between the magnetically conductive material in the first recesses and the magnetically conductive layers is not only circular, but also cylindrical, and thus greatly enlarged.

According to another preferred specific embodiment, for circuit boards which include magnetically conductive layers, situated one above the other, between the electrically conductive layers, electrically conductive layers may be combined to form subpackets. The recesses necessary for implementing the electrical vias are subsequently introduced into the subpackets, and the walls of the recesses are appropriately metal-plated. The subpackets are subsequently connected to the magnetically conductive layers. Recesses are then introduced into the resulting multilayer circuit board and filled with magnetically conductive material in order to implement the magnetic vias. Alternatively, all layers may initially be connected to one another. In this case, however, the magnetic vias must be completed first, and only then are the electrical vias completed.

BRIEF DESCRIPTION OF THE DRAWINGS

Preferred specific embodiments of the present invention are explained in greater detail below with reference to the appended figures.

DETAILED DESCRIPTION

Figure 1:
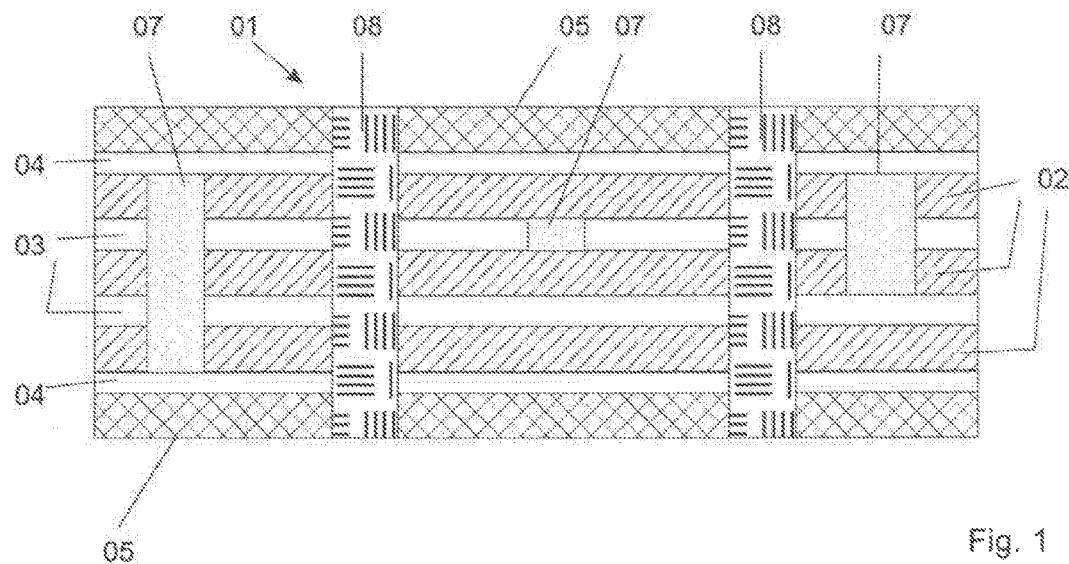
FIG. 1 shows a circuit board according to the present invention in a first specific embodiment.

FIG. 1 shows a first specific embodiment of a circuit board 01 according to the present invention. Circuit board 01 in this case includes three electrically conductive layers 02 situated one above the other and spaced apart from one another. Copper is generally used as material for the electrically conductive layers in circuit boards. A dielectric layer 03 is situated in each case between two electrically conductive layers 02. The two outer electrically conductive layers 02 are each adjoined by an auxiliary layer 04, which is used for electrical, magnetic, and thermal insulation, and at the same time, for the mechanical connection. Auxiliary layers 04 are followed in each case by a magnetically conductive layer 05. In the specific embodiment shown, the two magnetically conductive layers 05 form the outer layers, i.e., the cover layer and the base layer of circuit board 01. Individual electrically conductive layers 02 and magnetically conductive layers 05 are mechanically connected to one another with the aid of dielectric layers 03 and auxiliary layers 04, which preferably takes place by adhesive bonding.

Electrically conductive layers 02 are designed as structured layers for forming a conductor structure. They are electrically connected to one another via electrical vias 07. Recesses whose walls are preferably metal-plated are introduced into circuit board 01 in order to create electrical vias 07. Alternatively, rivets, pins, or sleeves made of an electrically conductive material may be introduced into the recesses and mechanically connected to circuit board 01. The shape and size of electrical vias 07 vary, depending on the intended purpose. Smaller electrical vias may be drilled, for example, while larger vias are preferably milled. The electrical vias may be designed in such a way that they connect structures of all electrically conductive layers 02 to one another. Alternatively, electrical vias 07 may also extend only up to one electrically conductive layer 02 situated in the circuit board interior. It is also possible for electrical vias 07 to extend between electrically conductive layers 02 in the circuit board interior. Electrically conductive layers 02 preferably form at least one coil.

Magnetically conductive layers 05 are preferably designed as ferromagnetic powder-filled plastic sheets or metal sheets. For example, iron powder or ferrite powder of various alloys may be used as ferromagnetic powder. Magnetically conductive layers 05 are connected to one another with the aid of magnetic vias 08. The magnetic flux conduction is thus expanded into the third dimension in a targeted manner. Magnetic vias 08 are created by introducing recesses into circuit board 01. The recesses may likewise be drilled or milled. Depending on the application, these recesses penetrate all or only some of the layers of the circuit board. Magnetically conductive material is introduced into the recesses. The magnetically conductive material may be a paste which contains ferromagnetic powder such as iron powder or ferrite powder of various alloys. Alternatively, however, rivets, pins, or sleeves made of magnetically conductive material which are introduced into the recesses and mechanically connected to circuit board 01 may also be used.

Circuit board 01 shown in FIG. 1 has a symmetrical sequence of the various layers, which is advantageous in particular with regard to the thermal stability. However, embodiments are also possible which do not use a symmetrical sequence of the various layers.

For manufacturing circuit board 01 shown in FIG. 1, the circuit board may be manufactured, based on a conventional multilayer electrical circuit board, in a first step in which a magnetically conductive layer 05 is additionally attached as a cover layer and base layer, using the customary technologies and materials. Magnetically conductive layer 05 may be laminated on, for example. Magnetic vias 08 are created in the next step by introducing recesses into circuit board 01 by milling or drilling, and are subsequently filled with magnetically conductive material.

Figure 2:
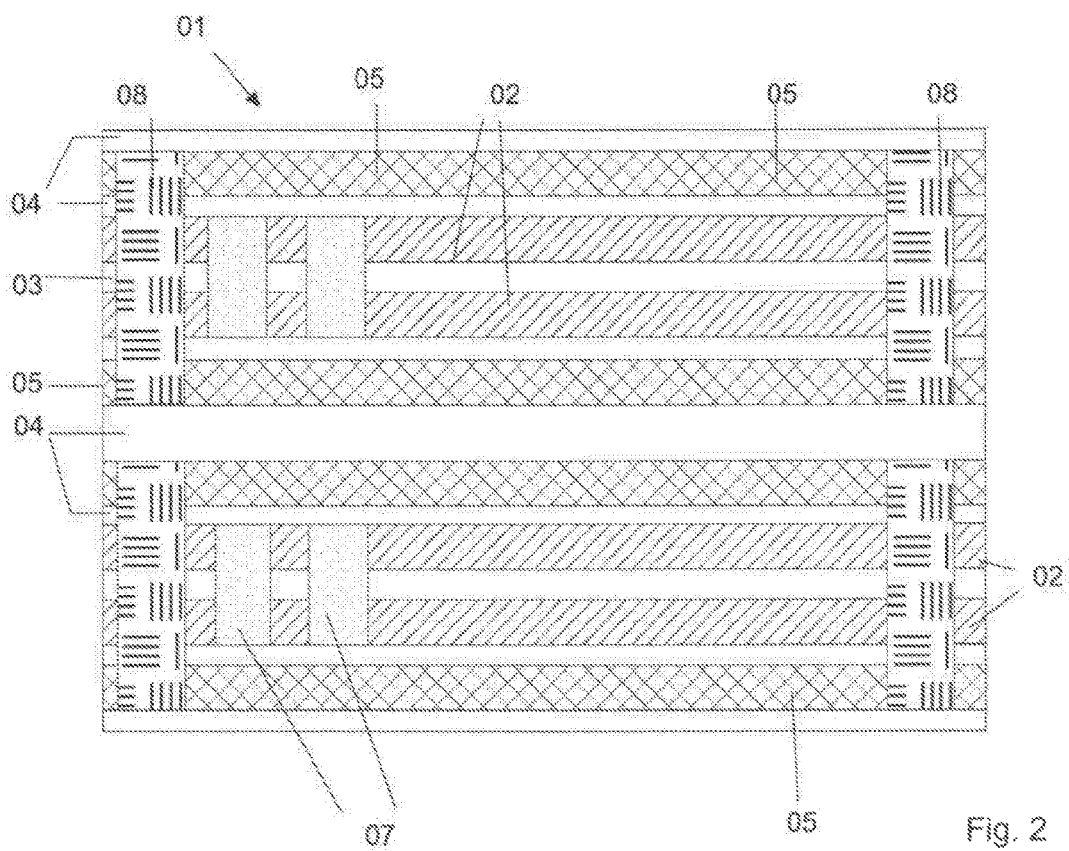
FIG. 2 shows the circuit board according to the present invention in a second specific embodiment.

FIG. 2 shows a second specific embodiment of circuit board 01 according to the present invention. Circuit board 01 includes four electrically conductive layers 02, in each case two electrically conductive layers 02 indirectly situated one above the other being connected to one another via electrical vias 07. A dielectric layer 03 is situated in each case between two adjacent electrically conductive layers 02. A significant difference from the embodiment shown in FIG. 1 is that circuit board 01 includes magnetically conductive layers 05 in the circuit board interior. Magnetically conductive layers 05 are situated indirectly adjacent to electrically conductive layers 02 via auxiliary layers 04. In each case two magnetically conductive layers 05 are magnetically connected to one another in a targeted manner with the aid of magnetic vias 08.

The manufacture of the specific embodiment shown in FIG. 2 may take place in such a way that two subpackets, each made up of two electrically conductive layers 02, are initially created and mechanically connected with the aid of a dielectric layer 03. Recesses, whose walls are metal-plated to form electrical vias 07, are subsequently introduced into the two subpackets. Each subpacket is subsequently provided in each case with two magnetically conductive layers 05 with the aid of auxiliary layers 04. Magnetically conductive layers 05 now form the outer layers of the two subpackets. Appropriate recesses are subsequently introduced into the subpackets and filled with magnetically conductive material to implement magnetic vias 08. The subpackets are subsequently mechanically connected to one another with the aid of an auxiliary layer 04.

Circuit board 01 shown in FIG. 2 includes an additional auxiliary layer 04 in each case as the cover layer and the base layer, which is also used in particular to protect the circuit board from environmental influences.

Alternatively, circuit board 01 may also be manufactured by initially connecting all layers of circuit board 01 to one another. In this case, however, magnetic vias 08 must be created first, and only then are electrical vias 07 created.

List of Reference Numerals 01 circuit board
02 electrically conductive layer
03 dielectric layer
04 auxiliary layer
05 magnetically conductive layer
06 —
07 electrical vias
08 magnetic vias

The invention claimed is:

1. A circuit board comprising:
   at least two electrically conductive layers situated one above the other and spaced apart from one another;
   at least one dielectric layer situated between the electrically conductive layers;

at least two-magnetically conductive layers spaced apart from one another, each magnetically conductive layer being situated at least indirectly adjacent to one of the electrically conductive layers, the magnetically conductive layers being made of ferromagnetic powder-filled plastic sheets or metal sheets, the magnetically conductive layers including a first magnetically conductive layer and a second magnetically conductive layer, the electrically conductive layers including a first electrically conductive layer and a second electrically conductive layer, the first electrically conductive layer and the second electrically conductive layer being between the first magnetically conductive layer and the second magnetically conductive layer; and vertical recesses for accommodating magnetic vias for magnetically connecting the magnetically conductive layers in a targeted manner, two of the vertical recesses penetrating each of the ferromagnetic powder-filled plastic sheets or metal sheets, wherein the circuit board is designed as a panel including a plurality of adjacently situated individual circuit boards, the magnetically conductive layers being applied over the entire surface area of the panel.

2. The circuit board as recited in claim 1 wherein the magnetic vias include a magnetically conductive material introduced into the vertical recesses.

3. The circuit board as recited in claim 1 wherein the first and the second magnetically conductive layers are outermost layers of the circuit board.

4. The circuit board as recited in claim 1 wherein a symmetrical sequence of the electrically conductive layers and the magnetically conductive layers is present.

5. The circuit board as recited in claim 4 wherein the symmetrical sequence includes insulating layers of the at least one dielectric layer.

6. The circuit board as recited in claim 1 wherein the magnetically conductive layers have magnetic flux-collecting properties or shielding properties.

7. The circuit board as recited in claim 1 wherein the circuit board is designed as a flexible circuit board.

8. The circuit board as recited in claim 1 wherein the electrically conductive layers form at least one coil.

9. The circuit board as recited in claim 1 further comprising at least two auxiliary layers, each of the auxiliary layers mechanically connecting one of the electrically conductive layers to one of the ferromagnetic powder-filled plastic sheets or metal sheets.

10. The circuit board as recited in claim 9 wherein the magnetically conductive layers are made of ferromagnetic powder-filled plastic sheets and the auxiliary layers are electrically and/or magnetically and/or thermally insulating.

11. The circuit board as recited in claim 1 wherein the magnetically conductive layers are made of metal sheets in the form of foil materials.

12. The circuit board as recited in claim 1 wherein the magnetic vias are formed of ferromagnetic materials.

13. The circuit board as recited in claim 1 further comprising electrical vias electrically connecting the electrically conductive layers, the electrical vias being distinct from the magnetic vias.

14. A circuit board comprising:
at least two electrically conductive layers situated one above the other and spaced apart from one another;
at least one dielectric layer situated between the electrically conductive layers;
at least two magnetically conductive layers spaced apart from one another, each magnetically conductive layer being situated at least indirectly adjacent to one of the electrically conductive layers, the magnetically conductive layers being made of ferromagnetic powder-filled plastic sheets or metal sheets, the magnetically conductive layers including a first magnetically conductive layer and a second magnetically conductive layer, the electrically conductive layers including a first electrically conductive layer and a second electrically conductive layer, the first electrically conductive layer and the second electrically conductive layer being between the first magnetically conductive layer and the second magnetically conductive layer; and
vertical recesses for accommodating magnetic vias for magnetically connecting the magnetically conductive layers in a targeted manner, two of the vertical recesses penetrating each of the ferromagnetic powder-filled plastic sheets or metal sheets,
wherein the electrically conducting layers includes a third electrically conductive layer and a fourth electrically conductive layer, the magnetically conductive layers including a third magnetically conductive layer and a fourth magnetically conductive layer, the third electrically conductive layer and the fourth electrically conductive layer being between the third magnetically conductive layer and the fourth magnetically conductive layer.

15. The circuit board as recited in claim 14 wherein the first electrically conductive layer, the second electrically conductive layer, the third electrically conductive layer and the fourth electrically conductive layer are between the first magnetically conductive layer and the fourth magnetically conductive layer.

* * * * *